United States Patent
Gos et al.

(10) Patent No.: US 12,202,279 B2
(45) Date of Patent: Jan. 21, 2025

(54) METHODS OF DETECTING AND ADJUSTING CONTACT OF A MICRO-STRUCTURAL FLUID EJECTOR TO A SUBSTRATE AND METHOD OF DETECTING A FAULT CONDITION IN FLUID FLOW FROM A MICRO-STRUCTURAL FLUID EJECTOR ONTO A SUBSTRATE

(71) Applicant: XTPL S.A., Wrocław (PL)

(72) Inventors: Tomasz Gos, Plock (PL); Tomasz Wysoczanski, Wroclaw (PL); Filip Granek, Mrozow (PL)

(73) Assignee: XTPL S.A., Wroclaw (PL)

( * ) Notice: Subject to any disclaimer, the term of this patent is extended or adjusted under 35 U.S.C. 154(b) by 680 days.

(21) Appl. No.: 17/594,387

(22) PCT Filed: Apr. 14, 2020

(86) PCT No.: PCT/IB2020/053500
§ 371 (c)(1),
(2) Date: Oct. 14, 2021

(87) PCT Pub. No.: WO2020/212840
PCT Pub. Date: Oct. 22, 2020

(65) Prior Publication Data
US 2022/0194085 A1    Jun. 23, 2022

(30) Foreign Application Priority Data
Apr. 15, 2019   (PL) .......................... 429617

(51) Int. Cl.
*B41J 25/308* (2006.01)
*B22F 10/14* (2021.01)
*B22F 12/90* (2021.01)
*B41J 2/165* (2006.01)
*G05B 19/042* (2006.01)
*H05K 3/12* (2006.01)
*B22F 1/0545* (2022.01)

(52) U.S. Cl.
CPC ............ *B41J 25/308* (2013.01); *B22F 10/14* (2021.01); *B22F 12/90* (2021.01); *B41J 2/16579* (2013.01); *G05B 19/0426* (2013.01); *H05K 3/1241* (2013.01); *B22F 1/0545* (2022.01); *G05B 2219/2646* (2013.01)

(58) Field of Classification Search
CPC .............................. B41J 25/308; B22F 12/90
See application file for complete search history.

(56) References Cited

U.S. PATENT DOCUMENTS

2005/0045653 A1 * 3/2005 Tanaka .................... B05B 15/68
222/1
2005/0235869 A1   10/2005 Cruchon-Dupeyrat et al.

FOREIGN PATENT DOCUMENTS

| CN | 105730006 A | * | 7/2016 |
| JP | 2001246299 A | * | 9/2001 |
| WO | 2020212840 A1 | | 10/2020 |

OTHER PUBLICATIONS

International Search Report and Written Opinion for International PCT Application No. PCT/IB2020/053500, dated Jul. 2, 2020.

* cited by examiner

Primary Examiner — Tabatha L Penny
(74) Attorney, Agent, or Firm — K&L Gates LLP

(57) ABSTRACT

Methods are disclosed relating to the operation of a micro-structural fluid ejector in a fluid printing apparatus. The methods include providing an imaging system, capturing a digital image of the micro-structural fluid ejector and its surroundings, and pre-processing the digital image to detect edges. A method of detecting contact of a micro-structural fluid ejector to a substrate includes repeatedly lowering the print head and measuring the length of a detected edge until the currently measured length is determined to be longer than a previously measured length. A method of adjusting contact of a micro-structural fluid ejector to a substrate includes calculating a bending coefficient A of the micro-structural fluid ejector and lowering the print head toward the substrate if the bending coefficient A is less than a minimum threshold value $A_{min}$, raising the print head away from the substrate if the bending coefficient A is greater than a maximum threshold value $A_{max}$, and making no change to the vertical displacement of the print head if the bending coefficient A is in the range of $A_{min}$ to $A_{max}$. A method of detecting a fault condition in fluid flow from a micro-structural fluid ejector onto a substrate includes analyzing the digital image to determine whether edges are present in a region of interest where fluid dispensed from the micro-structural fluid ejector should be present.

10 Claims, 21 Drawing Sheets

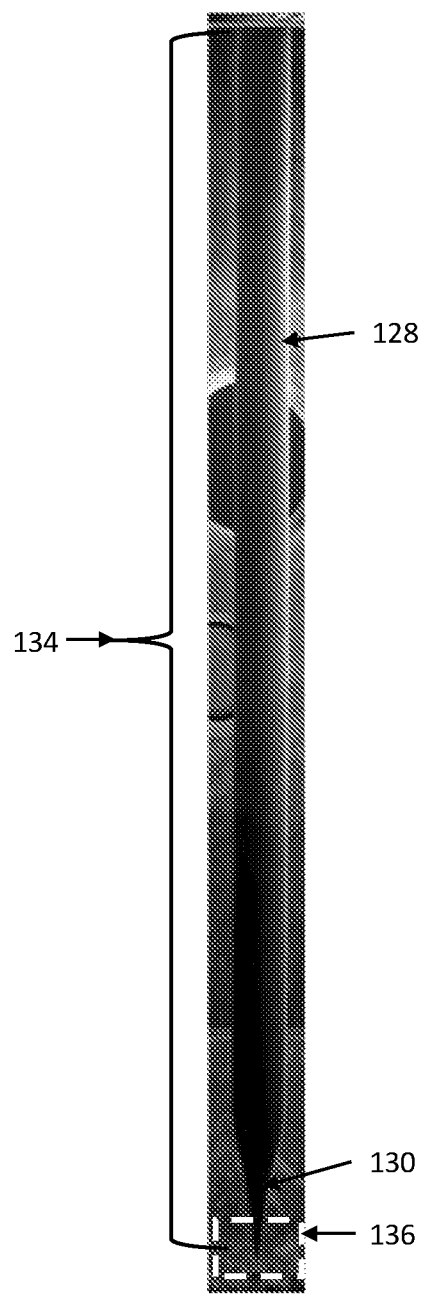 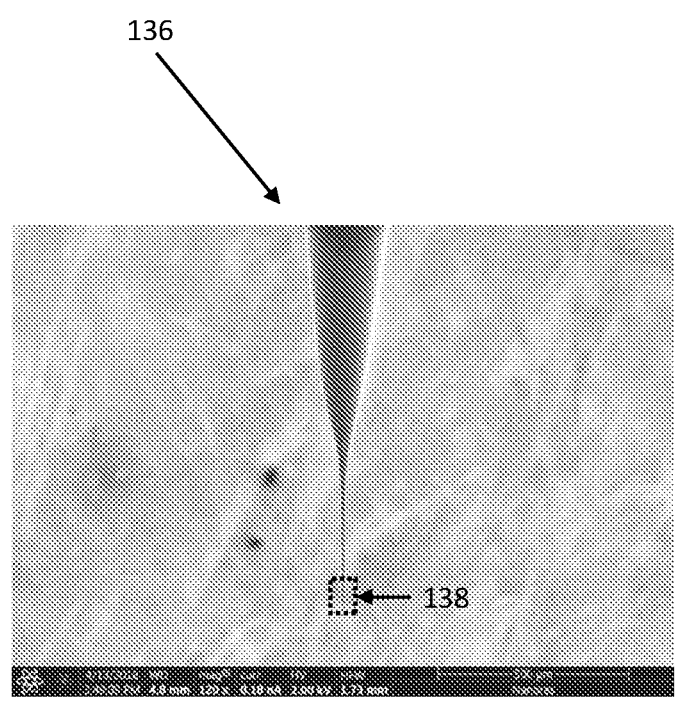
Fig. 4                    Fig. 5

METHODS OF DETECTING AND ADJUSTING CONTACT OF A MICRO-STRUCTURAL FLUID EJECTOR TO A SUBSTRATE AND METHOD OF DETECTING A FAULT CONDITION IN FLUID FLOW FROM A MICRO-STRUCTURAL FLUID EJECTOR ONTO A SUBSTRATE

CROSS-REFERENCE TO RELATED APPLICATIONS

This application is a U.S. National Stage Entry under 35 U.S.C. § 371 of International Patent Application No. PCT/IB2020/053500, entitled METHODS OF DETECTING AND ADJUSTING CONTACT OF A MICRO-STRUCTURAL FLUID EJECTOR TO A SUBSTRATE AND METHOD OF DETECTING A FAULT CONDITION IN FLUID FLOW FROM A MICRO-STRUCTURAL FLUID EJECTOR ONTO A SUBSTRATE, filed Apr. 14, 2020, which claims benefit of Polish Application No. P.429617, filed Apr. 15, 2019, the entire disclosures of which are hereby incorporated by reference herein.

BACKGROUND

Conductive lines can be formed on a substrate by dispensing conductive ink through a capillary tube nozzle which is in contact with the substrate. By using such a contact printing method, it is possible to form conductive lines having line widths in a range of about 1 μm to about 10 μm. However, there are difficulties with printing conductive lines over relatively large distances. The alignment precision required to maintain the trajectory of the print head parallel to the substrate is more stringent than can be easily achieved in ambient conditions. For example, if a substrate area of 10 cm by 10 cm is to be printed and a vertical displacement error of 10 μm is acceptable, the parallelism between the substrate surface and the trajectory of the print head should be 0.0001° or better. Therefore, a method of active control of vertical displacement is desirable.

Additionally, in order to implement a contact printing method, a method of precisely bringing the capillary tube into contact with the substrate and a method of detecting a fault condition in the fluid flow are desired.

SUMMARY OF THE INVENTION

The present disclosure relates to a method of detecting contact of a micro-structural fluid ejector to a substrate, a method of adjusting contact of a micro-structural fluid ejector to a substrate, and a method of detecting a fault condition in fluid flow from a micro-structural fluid ejector onto a substrate. The methods include the steps of providing a print head that includes a micro-structural fluid ejector, providing an imaging system, and providing a print head positioning system. The micro-structural fluid ejector consists of an output portion, an input portion, and a tapering portion between the output portion and the input portion. The output portion consists of an exit orifice of an inner diameter ranging between 0.5 μm and 5 μm. The print head is positioned above the substrate with the output portion of the micro-structural fluid ejector pointing downward. The imaging system includes a camera, configured such that the micro-structural fluid ejector's tapering portion and its surroundings are located within its field-of-view.

In one aspect, a method of detecting contact of a micro-structural fluid ejector to a substrate includes lowering the print head toward the substrate, capturing a digital image of the tapering portion and its surroundings, pre-processing the digital image to detect edges, and measuring the length of a detected edge. These steps are repeated until the currently measured length is determined to be longer than a previously measured length.

In another aspect, a method of adjusting contact of a micro-structural fluid ejector to a substrate includes coupling a pneumatic system to the print head, applying pressure to a fluid in the micro-structural fluid ejector while laterally displacing the print head relative to the substrate, capturing a digital image of the tapering portion and its surroundings, pre-processing the digital image to detect edges, calculating a bending coefficient A of the tapering portion and lowering the print head toward the substrate if the bending coefficient A is less than a minimum threshold value $A_{min}$, raising the print head away from the substrate if the bending coefficient A is greater than a maximum threshold value $A_{max}$, and making no change to the vertical displacement of the print head if the bending coefficient A is in the range of $A_{min}$ to $A_{max}$.

In yet another aspect, a method of detecting a fault condition in fluid flow from a micro-structural fluid ejector onto a substrate includes coupling a pneumatic system to the print head, applying pressure to a fluid in the in the micro-structural fluid ejector while laterally displacing the print head relative to the substrate, capturing a digital image of the tapering portion and its surroundings, pre-processing the digital image to detect edges, analyzing the digital image to determine whether edges are present in a region of interest where fluid dispensed from the micro-structural fluid ejector should be present, and returning a fault condition when edges are not detected in the region of interest.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which:

FIG. 4 is a scanning electron microscope (SEM) view of a portion of a capillary glass tube.

FIG. 5 is a scanning electron microscope (SEM) view of a tapering portion of the capillary glass tube, under low magnification.

DETAILED DESCRIPTION OF ILLUSTRATIVE EMBODIMENTS

The present disclosure relates to conductive ink compositions and methods of preparing these conductive ink compositions.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. And, as appropriate, any combination of two or more steps may be conducted simultaneously.

Figure 1:
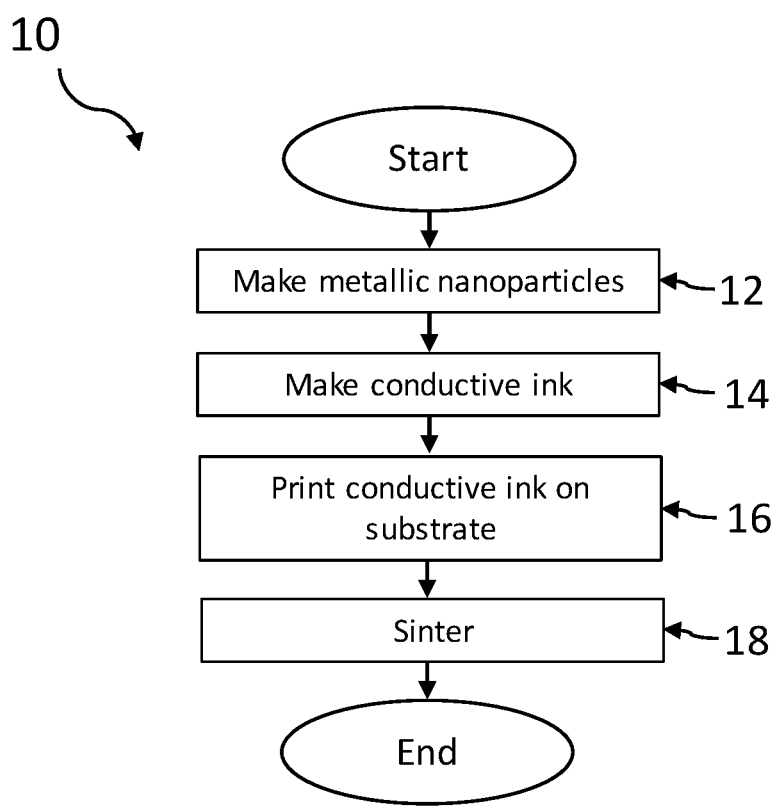
FIG. 1 is a flow diagram of a process of forming a printed conductive feature on a substrate.

FIG. 1 is a flow diagram of a process 10 of forming a printed conductive feature on a printable surface of a substrate. Metallic nanoparticles are used to form the conductive features. Among various metallic nanoparticles, silver nanoparticles (AgNPs) have become increasingly important for use in the electronics industries. Gold nanoparticles and copper nanoparticles can also be used. At step 12, the metallic nanoparticles are made. At step 14, a conductive ink is made from the metallic nanoparticles from step 12. Generally, the metallic nanoparticles are dispersed in solvents. The conductive ink composition may optionally include additives to better control its physicochemical properties. These additives include surfactants, binders, adhesion promoters, and antifoaming agents.

At step 16, the conductive ink composition is printed on a printable surface of a substrate using a fluid printing apparatus. Details of an illustrative fluid printing apparatus are described in detail with reference to FIGS. 2 through 10.

At step 18, the work piece, i.e., the substrate with the conductive feature thereon, is sintered. For example, sintering can be done in a convection oven in a range of 120° C. to 200° C. for 5 minutes. Alternatively, photonic sintering, such as by using a laser or a flash lamp, can be used.

Figure 2:
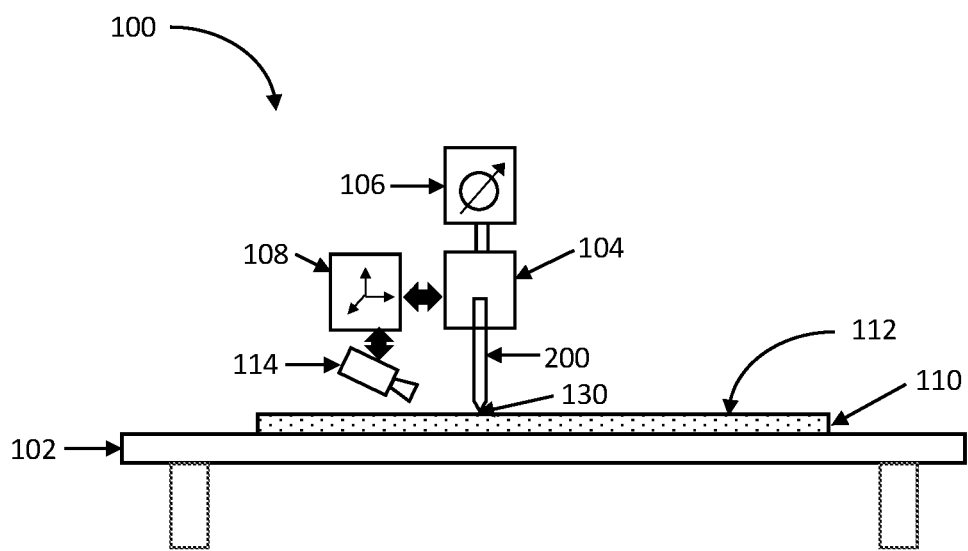
FIG. 2 is a block diagram view of an illustrative fluid printing apparatus.

FIG. 2 is a block diagram view of an illustrative fluid printing apparatus. The fluid printing apparatus 100 includes a substrate stage 102, a print head 104, a pneumatic system 106, a print head positioning system 108, and an imaging system 114. A substrate 110 is fixed in position on the substrate stage 102 during the printing and has a printable surface 112, which is facing upward and facing towards the print head 104. The print head 104 is positioned above the substrate 110.

The substrate 110 can be of any suitable material, such as glass, plastic, metal, or silicon. A flexible substrate can also be used. Furthermore, the substrate can have existing metal lines, circuitry, or other deposited materials thereon. For example, the present disclosure relates to an open defect repair apparatus, which can print lines in an area where there is an open defect in the existing circuit. In such case, the substrate can be a thin-film transistor array substrate for a liquid crystal display (LCD).

The print head includes a micro-structural fluid ejector. Commercially available capillary glass tubes can be modified to be used as the micro-structural fluid ejector. For example, capillary glass tubes called Eppendorf™ Femtotips™ Microinjection Capillary Tips, with an inner diameter at the tip of 0.5 µm, are available from Fisher Scientific. A commercially available capillary glass tube 120 is shown schematically in FIG. 3. A plastic handle 122 is attached to the capillary glass tube 120 around its circumference. The plastic handle 122 includes an input end 124 and a threaded portion 126 near the input end 124 which enables a threaded connection to an external body or external conduit (not shown in FIG. 3). The input end 124 has an inner diameter of 1.2 mm.

Figure 6:
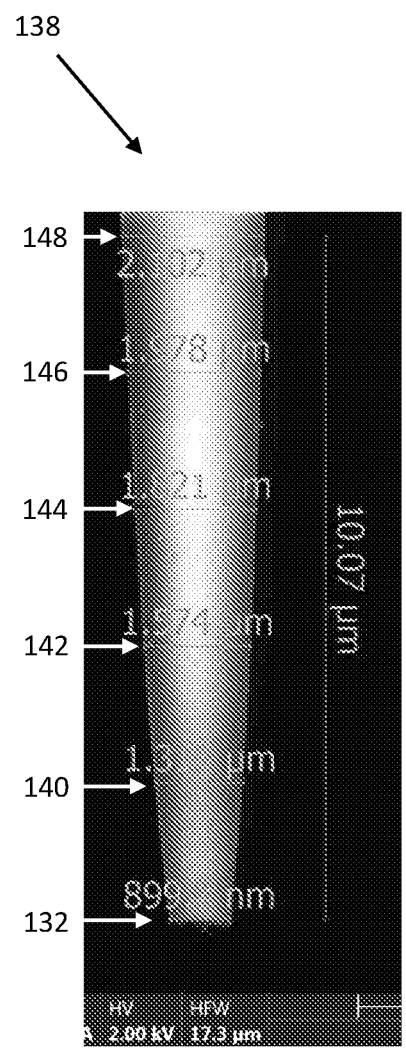
FIG. 6 is a scanning electron microscope (SEM) view of a tapering portion of the capillary glass tube, under high magnification.

The capillary glass tube includes an elongate input portion 128 and a tapering portion 130. There is an externally visible portion 134 of the capillary glass tube 120. Some of the elongate input portion 128 may be obscured by the surrounding plastic handle 122. The tapering portion 130 tapers to an output end 132 with a nominal inner diameter of 0.5 µm. The reduction of diameter along the tapering portion 130 from the elongate input portion 128 to the output end 132 is more clearly illustrated in FIGS. 4 through 6. FIG. 4 is a scanning electron micrograph view (formed from stitching together multiple SEM images) of the entire externally visible portion 134 of the capillary glass tube 120. A first magnification region 136 of the tapering portion 130 including the output end 132, observed under low magnification in a scanning electron microscope (SEM), is shown in FIG. 5. Furthermore, a second magnification region 138 located within the first magnification region 136, observed under high magnification in a scanning electron microscope (SEM), is shown in FIG. 6. The outer diameter measured at the output end 132 and at different longitudinal locations along the tapering portion (140, 142, 144, 146, and 148) are shown in FIG. 6 and in Table 1. The outer diameter is smallest at the output end 132 and increases with increasing longitudinal distance from the output end 132. A longitudinal distance 90 between output end 136 and longitudinal location 148 is measured to be approximately 10.07 µm.

TABLE 1

| Longitudinal Location | Outer diameter (µm) |
|---|---|
| 148 | 2.102 |
| 146 | 1.978 |
| 144 | 1.821 |
| 142 | 1.574 |
| 140 | 1.315 |
| 132 | 0.8993 |

Figure 3:
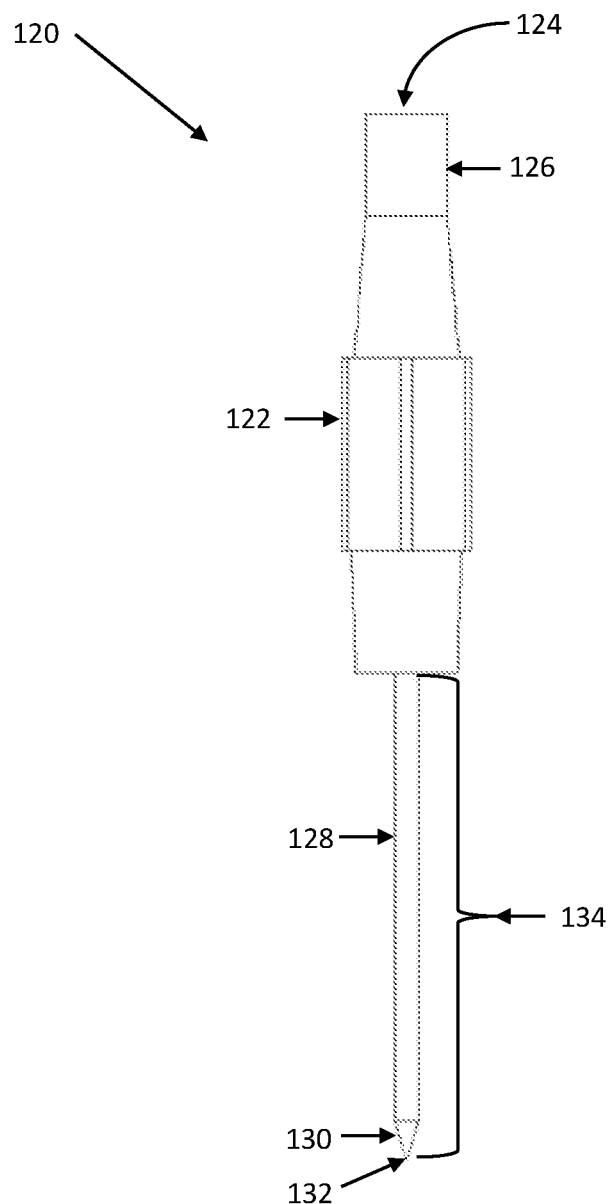
FIG. 3 is a schematic side view of a capillary glass tube.
Figure 7:
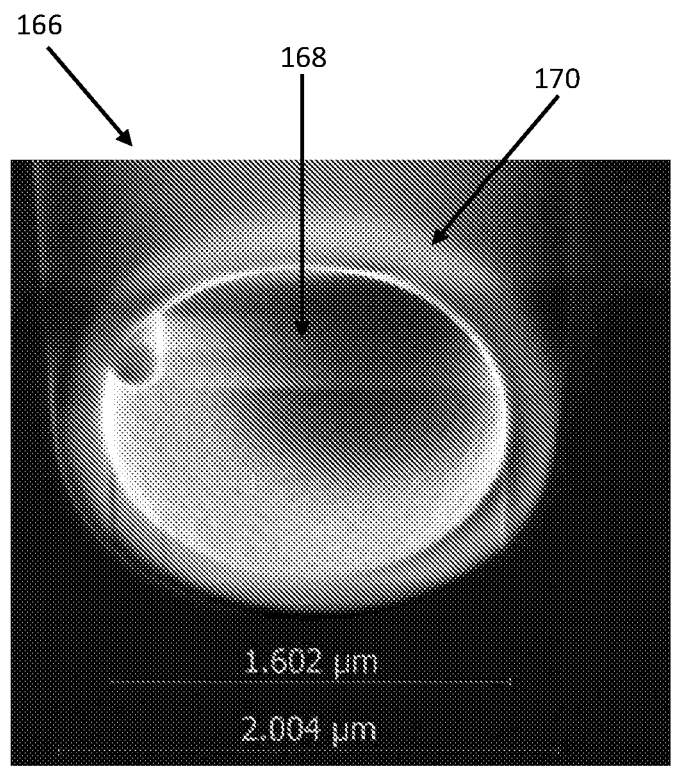
FIG. 7 is a scanning electron microscope (SEM) view of the output portion after focused-ion beam treatment, under high magnification.
Figure 8:
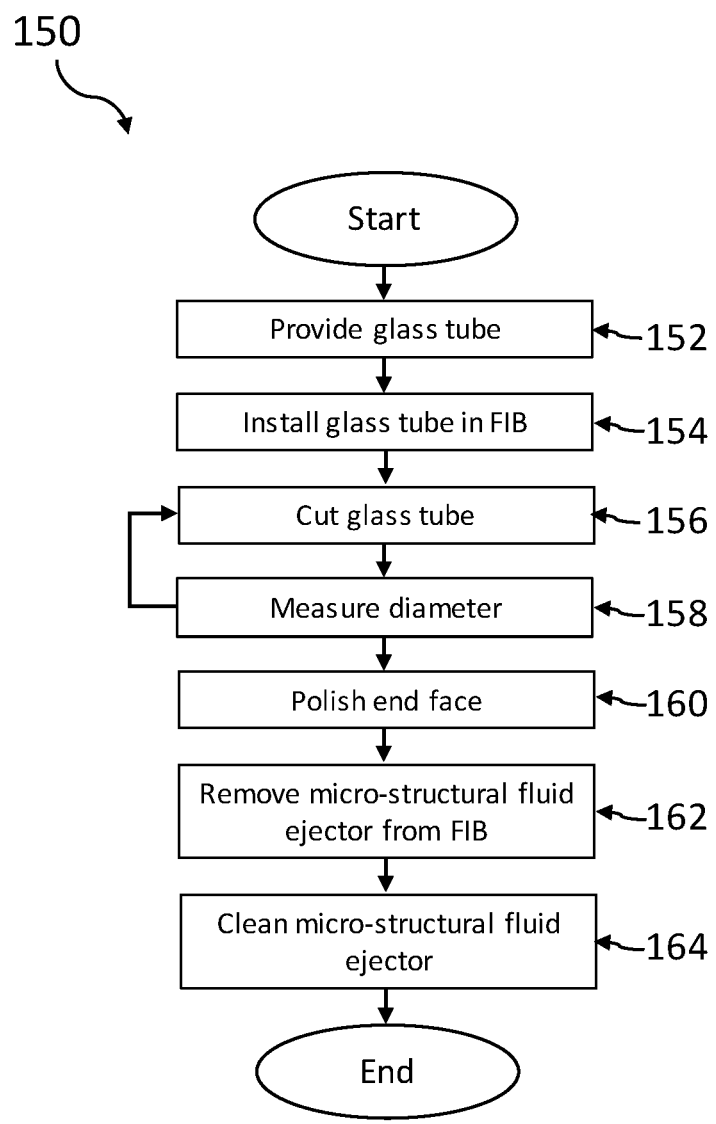
FIG. 8 is a flow diagram of a method of forming a micro-structural fluid ejector.

In a case where the output inner diameter (nominally 0.5 µm in this example) is too small, it is possible to increase the output inner diameter by cutting the capillary glass tube 120 at a suitable longitudinal location along the tapering portion 130, for example longitudinal location 140, 142, 144, 146, or 148. A method 150 of treating the capillary glass tube 120 to obtain a micro-structural fluid ejector 200 is shown in FIG. 8. At step 152, a capillary glass tube 120, such as shown in FIG. 3 is provided. At step 154, the capillary glass tube is installed in a focused-ion beam (FIB) apparatus. For example, a plasma-source $Xe^+$ FIB (also called PFIB) is used. At step 156, a longitudinal location along the tapering portion 130 is selected, and the focused ion beam is directed to it, with sufficient energy density for cutting the glass tube. At step 156, a cut is made using the focused-ion beam across the tapering portion at the selected longitudinal location. After the previous step 156 is completed, a scanning electron microscope (in the FIB apparatus) is used to measure the inner diameter at the output end (step 158). If the measured inner diameter is too small, step 156 is carried out at another longitudinal location along the tapering portion, and step 158 is carried out. Steps 156 and 158 are repeated until the desired inner diameter is obtained. As shown in FIG. 7, the final cutting (step 156) defines an output portion 166 including the exit orifice 168 and the end face 170. In many cases, the exit orifice 168 has an output inner diameter ranging between 0.5 µm and 5 µm. However, the output inner diameter can be chosen to be greater than 5 µm. In the example shown in FIG. 7, the output inner diameter is measured to be 1.602 µm and the output outer diameter is measured to be 2.004 µm. Then, at step 160, the energy of the focused ion beam is reduced, and the focused ion beam is directed to the end face 170. The end face 170 is polished using the focused ion beam, to obtain an end face with a surface roughness of less than 0.1 µm, and preferably ranging between 1 nm and 20 nm. In the end face example shown in FIG. 7, it can be deduced from the outer and inner diameter dimensions that the end face has a surface roughness of less than 0.1 µm. When the polishing capability of the FIB apparatus is taken into account, it is considered likely that the surface roughness of the end face ranges between 1 nm and 20 nm. Upon the conclusion of step 160, a micro-structural fluid ejector 200 is obtained. Then, at step 162, the micro-structural fluid ejector 200 is removed from the FIB apparatus. Additionally, it is preferable to clean the micro-structural fluid ejector, particularly the output portion, by immersion in a solvent while applying pressure in the range of 10,000 Pa to 1,000,000 Pa (step 164). We have found it effective to use a solvent that is identical to a solvent used in the fluid. For example, if the fluid contains propylene glycol, it is found effective to use propylene glycol as a solvent for cleaning in this step 164. The foregoing is a description of an example of a micro-structural fluid ejector obtained by modification of a capillary glass tube. More generally, it is contemplated that micro-structural fluid ejector can be obtained from other materials, such as plastics, metals, and silicon, or from a combination of materials.

Figure 9:
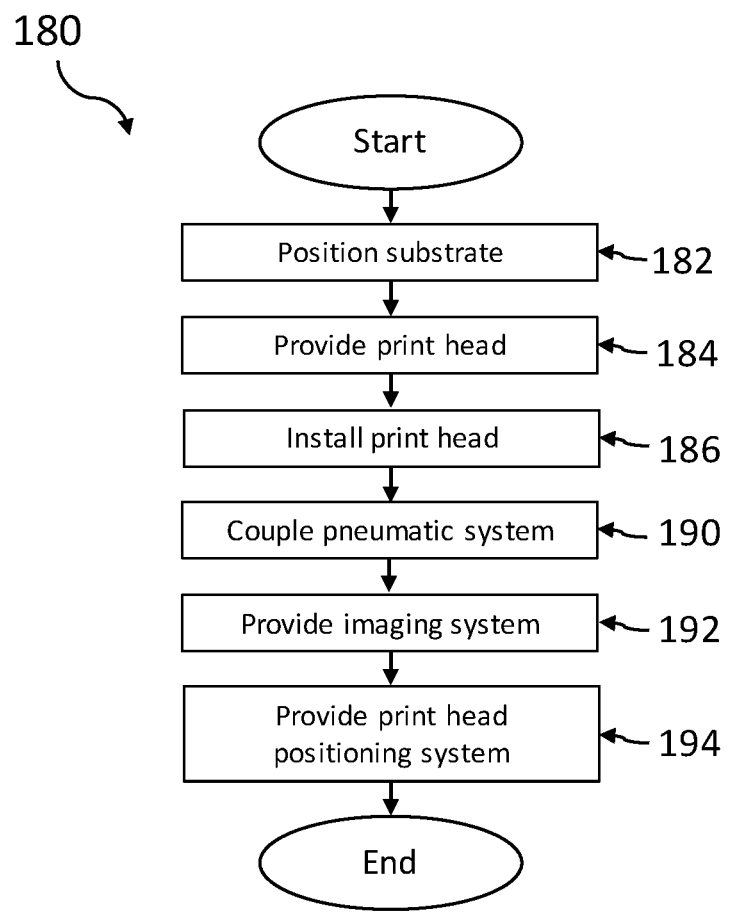
FIG. 9 is a flow diagram of a method of preparing the systems in a fluid printing apparatus.

Upon completion of step 162 and/or step 164, the micro-structural fluid ejector 200 is ready to install in the print head. FIG. 9 is a flow diagram of a method 180, of preparing systems in a fluid printing apparatus (FIG. 2). At step 182, a substrate 110 is positioned at a fixed position on a substrate stage 102. At step 184, a print head 104 is provided. This step includes preparing the micro-structural fluid ejector, as described in FIG. 8, and installing it in a print head 104. At step 186, the print head 104 is installed above the printable surface 112 of the substrate 110 (FIG. 2), the micro-structural fluid ejector 200 being oriented with the exit orifice 168 pointing downward. Additionally, at step 186, a fluid (an ink, for example) can be supplied to print head 104. In the example shown in FIG. 10, the fluid is supplied to the micro-structural fluid ejector 200 via a fluid conduit 208. At step 190, a pneumatic system 106 is coupled to the print head 104. For example, the pneumatic system includes a pump and a pressure regulator.

Figure 10:
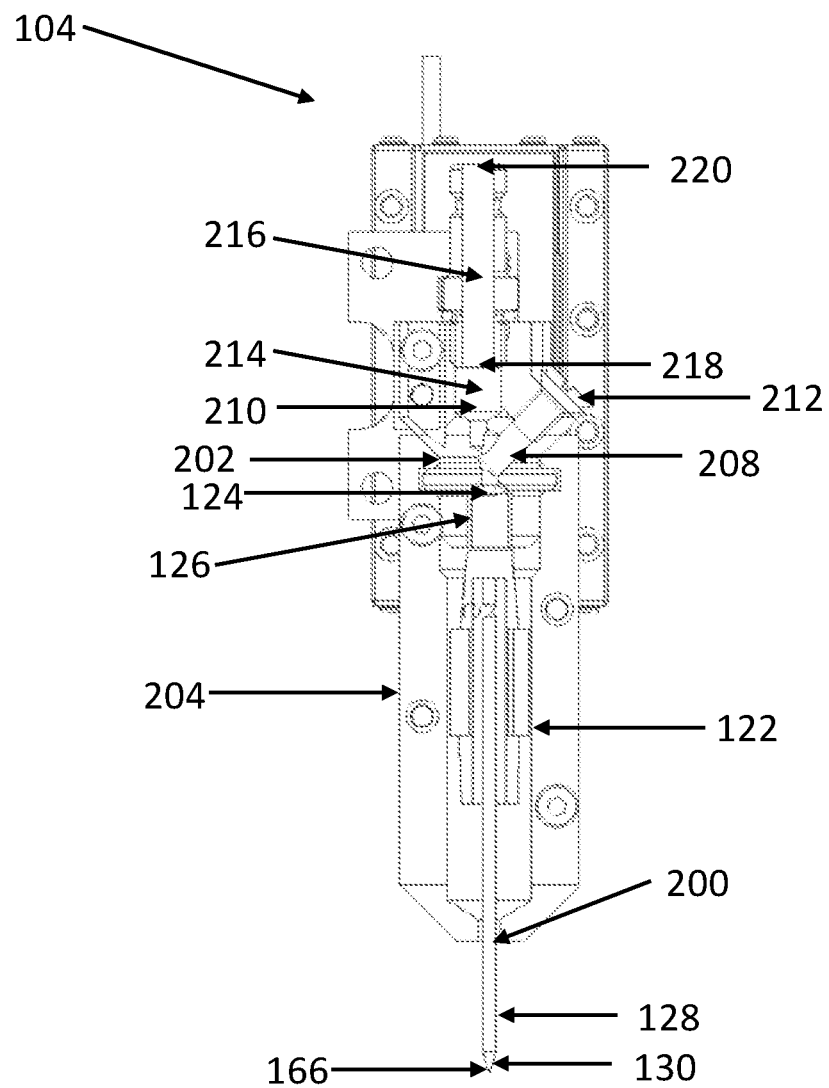
FIG. 10 is a cut-away schematic side view of a print head.

An example of a print head 104 is shown in FIG. 10. The print head 104 includes a micro-structural fluid ejector 200. A portion of the micro-structural fluid ejector 200, and its plastic handle 122, are encased in the external housing 204. The elongate input portion 128 extends downward from the external housing 204. An output portion 166, including the exit orifice 168 and end face 170 (FIG. 7), are located downward from the elongate input portion 128. The tapering portion 130 is located between the output portion 166 and the elongate input portion 128. The external housing 204 encases a main body 202, which includes a pneumatic conduit 210 and a fluid conduit 208. Both the pneumatic conduit 210 and the fluid conduit 208 are connected to the input end 124 of the plastic handle 122. The plastic handle 122 is attached to the main body 202 by the threaded portion 126 of the plastic handle 122. The pneumatic conduit 210 has a threaded portion 214 on its input end which is used to attach the output end 218 of a pneumatic connector 216 thereto. The pneumatic connector 216 has an input end 220 to which the pneumatic system 106 is connected (not shown in FIG. 10). Fluid (for example, ink) is supplied to the micro-structural fluid ejector 200 via the fluid conduit 208. As shown in FIG. 10, fluid conduit 208 is plugged with a fluid inlet plug 212, after fluid has been supplied to the micro-structural fluid ejector 200. The ink can be stored in the micro-structural fluid ejector 200 in the print head 104, or the ink can be stored in a fluid reservoir that supplies ink to the print head 104 via the fluid conduit 208.

Figure 11:
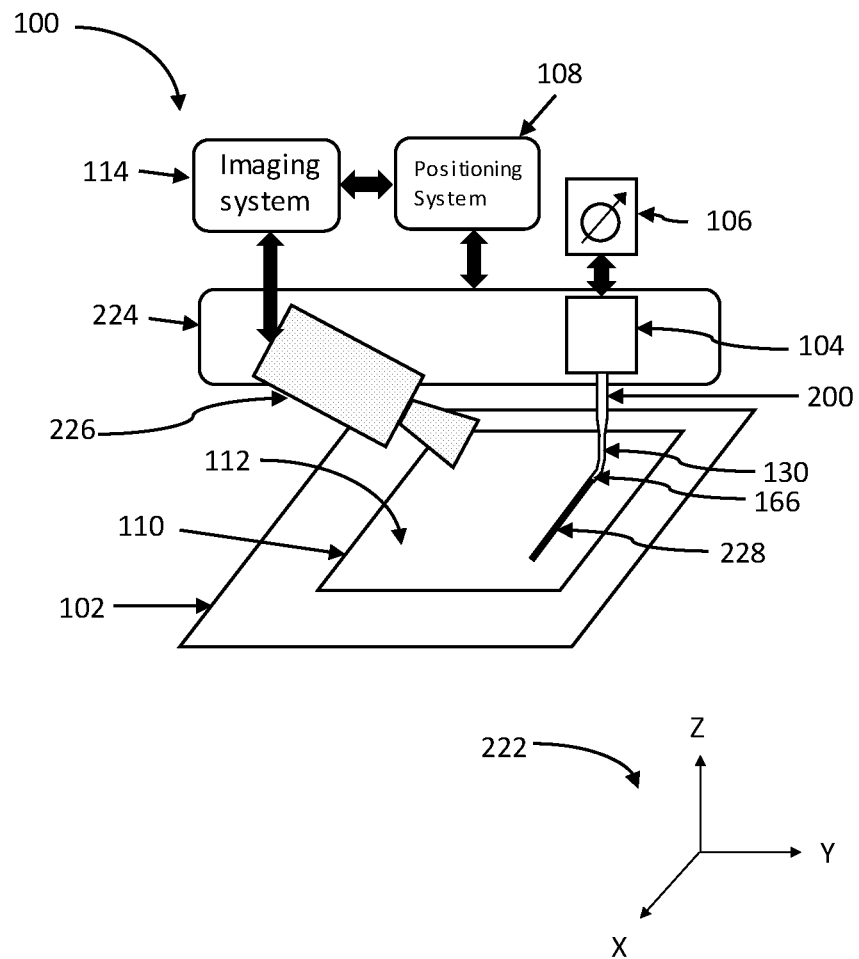
FIG. 11 is a schematic view of an illustrative fluid printing apparatus.

The method 180 is explained with continuing reference to FIG. 9. At step 192, an imaging system 114 is provided, and at step 194, a print head positioning system 108 is provided. An implementation of the fluid printing apparatus 100 is shown schematically in FIG. 11. A coordinate system 222 is shown with the Z-axis being a direction of vertical displacement and the X- and Y-axes forming a plane of lateral displacement. The imaging system 114 includes a camera 226, which is configured such that the tapering portion 130 and the output portion 166 are located within the field-of-view of the camera 226. The imaging system 114 additionally includes image processing software resident on a computer that communicates with the camera 226. The print head positioning system 108 includes a vertical positioner 224 and a lateral positioner. The print head 104 and the camera 226 are mounted to the vertical positioner 224, so that the vertical displacement of the print head 104 and the camera 226 are in unison. The print head positioning system 108 controls the vertical displacement of the print head 104 and the lateral displacement of the print head 104 relative to the substrate 110. The lateral displacement of the print head relative to the substrate means one of the following options: (1) the substrate is stationary and the print head is moved laterally; (2) the print head is not moved laterally and the substrate is moved laterally; and (3) both the print head and the substrate are moved laterally. In option (1), the print head is moved laterally and vertically. For example, option (1) can be realized by mounting the vertical positioner 224 to a lateral positioner. In option (2), the print head is moved vertically but is not moved laterally, and the substrate stage, to which the substrate is fixed in position, is moved laterally. For example, option (2) can be realized by attaching the substrate stage 102 to a lateral positioner. Fluids that can be printed by the fluid printing apparatus include nanoparticle inks, such as inks containing titanium dioxide nanoparticles and silver nanoparticles. Other metallic nanoparticles including gold nanoparticles and copper nanoparticles are possible. The nanoparticles can be quantum dot nanoparticles, such as CdSe, CdTe, and ZnO. Inks containing carbon black can also be printed. The line width of the printed feature is greater than the output inner diameter by a factor ranging between 1.0 and 20.0. Typically, the output inner diameter is in a range of 0.5 μm to 5.0 μm. In the examples given herein, a micro-structural fluid ejector having an output inner diameter of 3.5 μm was used.

Cameras were considered for use in the imaging system 114 and a camera having the following operational parameters ("Operating range" column in Table 2) was found to be suitable. Operational parameters of a preferred camera are tabulated in the following Table 2. In the current implementation, the operational parameters shown in the "Actual values" column in Table 2 were typically used. It was found that the frame rate should be sufficiently high to allow images to be captured while the print head is laterally displaced relative to the substrate. Accordingly, frame rates of 10 frames per second or greater are preferred. In order to have sufficient resolution for the image analysis, camera resolutions of 0.2 Megapixels or greater are preferred. The field-of-view of the camera should be large enough to capture the tapering portion and its surroundings. The horizontal dimension and the vertical dimension of field-of-view of the camera should each be in a range of 50 to 500 times the output inner diameter (at the tip of the nozzle).

TABLE 2

| Parameter name | Operating range | Actual values |
|---|---|---|
| Zoom (optical) | ×6-×30 | ×24 |
| Field-of-view (horizontal × vertical) (μm) | 2600 × 1700-520 × 340 | 660 × 440 |
| Frame rate (frames per second) | 10-58.7 | 17.7 |
| Resolution (Megapixels) | 0.2-6.41 | 6.41 |
| Exposure time (ms) | 0.013-999 | 50 |

Figure 12:
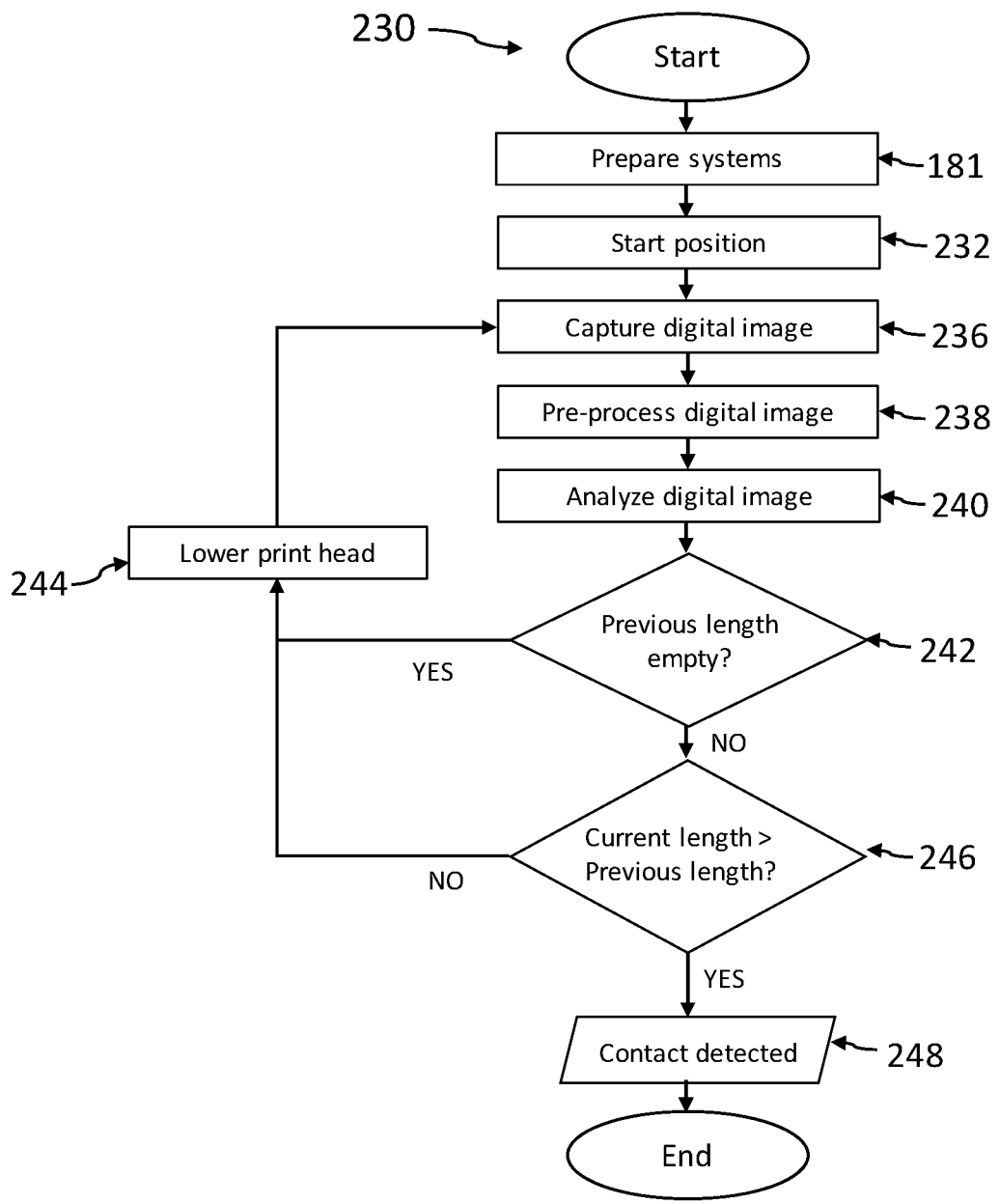
FIG. 12 is a flow diagram of a method of detecting contact of a micro-structural fluid ejector to a substrate, according to a first embodiment.

FIG. 12 is a flow diagram of a method 230 of detecting contact of a micro-structural fluid ejector to a substrate, according to a first embodiment. Step 181 corresponds to the method 180 shown in FIG. 9. Among the steps shown in FIG. 9, the step 190 of coupling a pneumatic system 106 to the print head 104 is not necessary if no fluid will be dispensed from the micro-structural fluid ejector 200 after carrying out method 230. However, in order to subsequently dispense fluid from the micro-structural fluid ejector 200, step 190 should be carried out.

Figure 13:
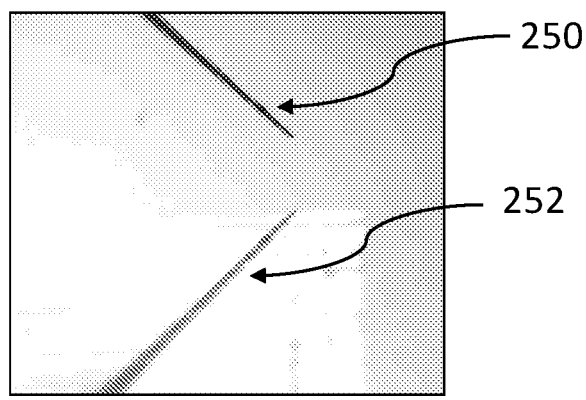
FIG. 13 is a first example digital image captured while implementing a method of detecting contact of a micro-structural fluid ejector to a substrate.
Figure 14:
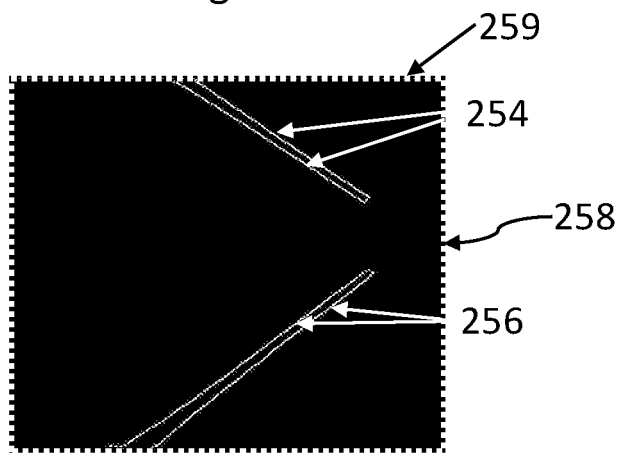
FIG. 14 is a result of pre-processing of the example digital image of FIG. 13.

At step 232, the print head 104 is displaced relative to the substrate 110 to a desired start position above the substrate 110, where the micro-structural fluid ejector 200 and the substrate 110 are not in contact. For example, this start position can be set to be such that the output portion 166 (tip of the nozzle) is 20 to 100 μm above the printable surface 112 of the substrate 110. At step 236, a digital image of the tapering portion 130 and its surroundings is captured using the camera 226. Here, the term surroundings is understood to include the output portion 166, even though the output portion may be too small to be easily discernible in the digital image. Additionally, the term surroundings is understood to include a reflection of the tapering portion 130 in the substrate 110. FIG. 13 is an example of a digital image of the tapering portion and its surroundings. FIG. 13 includes an image 250 of the tapering portion and an image 252 of a reflection of the tapering portion. At step 238, the digital image undergoes pre-processing. Pre-processing includes conversion of color to grayscale (if the image has been captured in color), noise smoothing, noise filtering, and edge detection. A result of the image pre-processing step (step 238) is a binary image in which detected edges are represented by white pixels. FIG. 14 is a result of pre-processing on the digital image of FIG. 13. FIG. 14 includes detected edges 254 corresponding to the image of the tapering portion 250 and detected edges 256 corresponding to the image of the reflection of the tapering portion 252.

At step 240, the imaging system analyzes the pre-processed digital image. The analysis is conducted within a region of interest (ROI) where the tapering portion and its reflection are expected to be present. In the case of FIG. 14, the entirety of the digital image has been chosen to be the ROI 258. Alternatively, a portion of the digital image can be selected as the ROI, where the ROI includes a region where the tapering portion and its reflection are expected to be present. For example, selecting a portion of the digital image as the ROI may be suitable when the digital image includes a wider field-of-view than is shown in FIG. 13. At step 240, the length of the longest contiguous detected edge in the ROI 258 intersecting the ROI's top edge 259 (one of the detected edges 254) is calculated to be 108 pixels. This length of the longest contiguous detected edge that intersects the top edge of the region of interest is referred to as the current length.

At decision step 242, the imaging system determines whether the previous length has an empty value. The previous length has an empty value when there has been no previous iteration of step 240. If the previous length is empty, then step 244 is carried out. If the previous length is not empty, then decision step 246 is carried out. At decision step 246, the imaging system determines whether the current length is greater than a sum of the previous length and a minimum length difference. If the current length is greater than the sum, then it is determined that the micro-structural fluid ejector is in contact with the substrate (step 248). If the current length is not greater than the sum, then step 244 is carried out. In other words, step 244 is carried out if: (1) the previous length is empty; or (2) the current length is not greater than the sum of the previous length and a minimum length difference.

At step 244, the current length is retained as the previous length, and the print head is lowered toward the substrate by a vertical distance. Typically, the vertical distance is in a range of 0.5 µm to 10 µm. In the examples shown in FIGS. 13 through 18, the vertical distance is 2 µm. After step 244, another iteration of step 236 is carried out.

Figure 15:
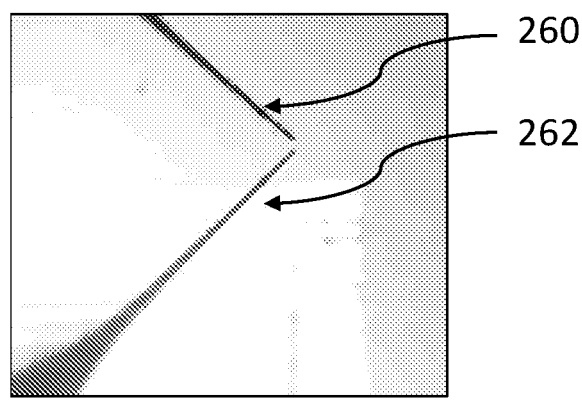
FIG. 15 is a second example digital image captured while implementing a method of detecting contact of a micro-structural fluid ejector to a substrate.
Figure 16:
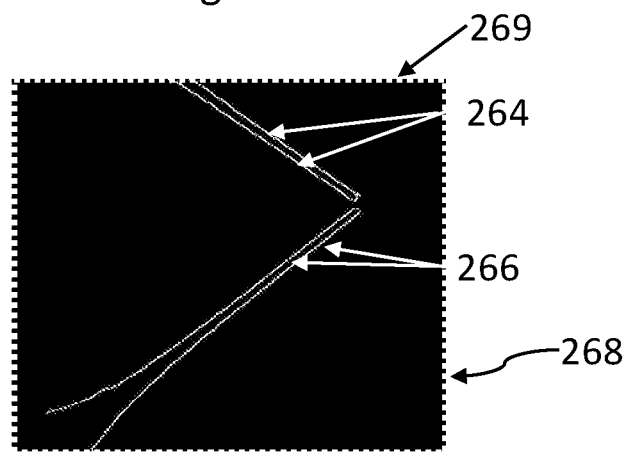
FIG. 16 is a result of pre-processing of the example digital image of FIG. 15.

In the example shown in FIGS. 13 and 14, the previous length is empty, so step 244 is carried out after decision step 242. The print head is lowered by 2 µm toward the substrate, the current length of 108 pixels is retained as the previous length, and a second iteration of step 236 is carried out. FIG. 15 is an example of a digital image of a tapering portion and its surroundings, captured after the first iteration of step 244 to lower the print head toward the substrate. FIG. 15 includes an image 260 of the tapering portion and an image 262 of a reflection of the tapering portion. Compared to FIG. 13, the tapering portion and its reflection are closer together. FIG. 16 is a result of pre-processing of the digital image of FIG. 15 (step 238). FIG. 16 includes detected edges 264 corresponding to the image of the tapering portion 260 and detected edges 266 corresponding to the image of the reflection of the tapering portion 262. At step 240, the length of the longest contiguous detected edge in the ROI 268 intersecting the ROI's top edge 269 (one of the detected edges 264) is calculated to be 108 pixels. Since it is determined that the previous length is not empty (step 242), the current length is compared to the previous length (step 246). The minimum length difference can be set to 0 or to a suitable positive value which may be 50 pixels or less, for example. In this implementation, the minimum length difference is set to 50 pixels. Both the current length and previous length are 108 pixels, so the current length is not greater than the sum of the previous length and a minimum length difference, regardless of the value selected for the minimum length difference.

Figure 17:
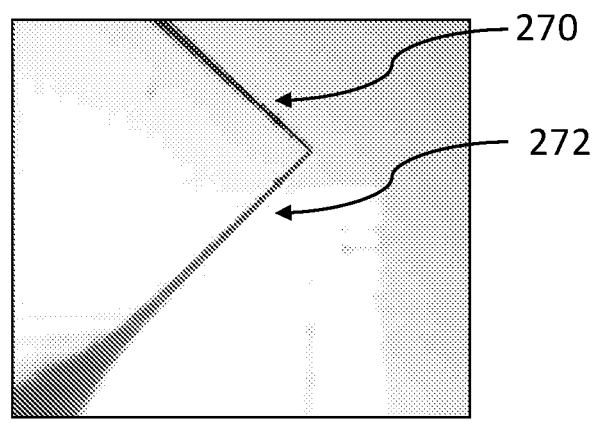
FIG. 17 is a third example digital image captured while implementing a method of detecting contact of a micro-structural fluid ejector to a substrate.
Figure 18:
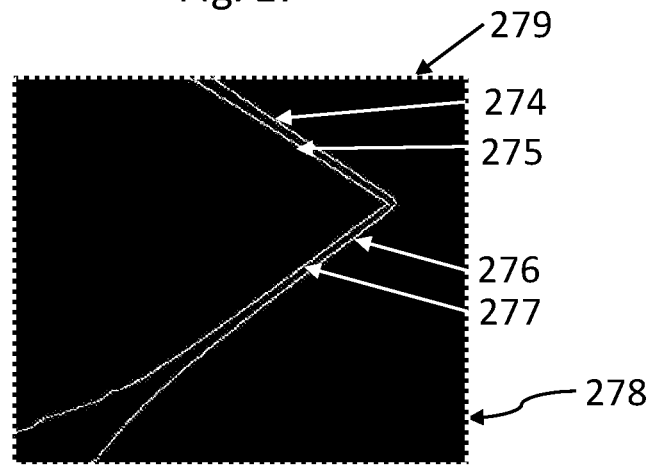
FIG. 18 is a result of pre-processing of the example digital image of FIG. 17.

At step 244, the print head is lowered by 2 µm toward the substrate, the current length of 108 pixels is retained as the previous length, and a third iteration of step 236 is carried out. FIG. 17 is an example of a digital image of a tapering portion and its surroundings, captured after the second iteration of step 244 to lower the print head toward the substrate. The image of the tapering portion 270 has merged with the image of the reflection of the tapering portion 272 because the tapering portion is in contact with the substrate. FIG. 18 is a result of pre-processing of the digital image of FIG. 17 (step 238). FIG. 18 includes detected edges 274, 275 corresponding to the image of the tapering portion 270 and detected edges 276, 277 corresponding to the image of the reflection of the tapering portion 272. There are two contiguous detected edges (274 and 276 merged together, and 275 and 277 merged together) in the ROI 278 that intersect the ROI's top edge 279. At step 240, the length of the longest contiguous detected edge in the ROI 278 intersecting the top edge 279 is calculated to be 310 pixels. Since it is determined that the previous length is not empty (step 242), the current length is compared to the previous length (step 246). The current length is 310 pixels and the sum of the previous length (108 pixels) and the minimum length difference (50 pixels) is 158 pixels. Since the current length is greater than the sum (step 242), it is determined that the micro-structural fluid ejector and the substrate are in contact (step 246). When it is determined that the micro-structural fluid ejector and the substrate are in contact, the print head is no longer lowered toward the substrate.

We have chosen a minimum length difference (50 pixels) to preclude slight variations in the calculated length of the longest contiguous detected edge when the tapering portion has not yet merged with its reflection. The minimum length difference can be set to 0 or to a positive value that is smaller than the length of a detected edge of the reflection of the tapering portion. We have defined a contiguous edge to mean an array of white pixels where each white pixel is no more than 2 pixels along the vertical direction away from another white pixel.

Figure 19:
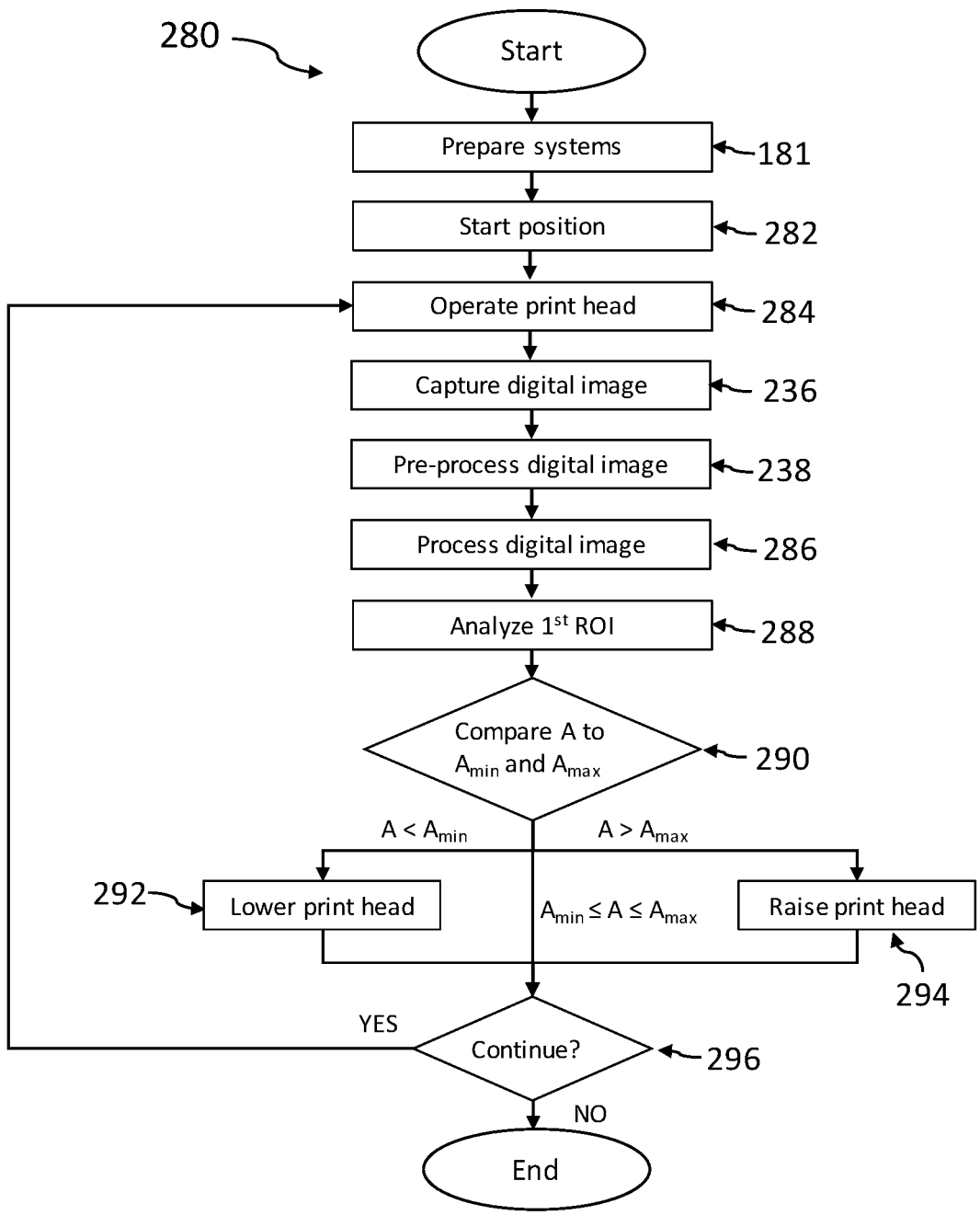
FIG. 19 is a flow diagram of a method of adjusting contact of a micro-structural fluid ejector to a substrate, according to a second embodiment.

FIG. 19 is a flow diagram of a method 280 of adjusting contact of a micro-structural fluid ejector to a substrate, according to a second embodiment. Step 181 corresponds to the method 180 shown in FIG. 9. At step 282, the print head 104 is displaced relative to the substrate 110 to a start position. Preferably, the start position is the position at which the micro-structural fluid ejector and the substrate are in contact, as determined in method 230 (FIG. 12). At step 284, the print head 104 is operated, namely pressure is applied to a fluid in the micro-structural fluid ejector 200 while the print head 104 is laterally displaced relative to the substrate 110 at a lateral displacement speed. Typically, the pressure applied at the input portion of the micro-structural fluid ejector is 1 bar to 4 bar, and the lateral displacement speed is in a range of 1 mm/sec to 10 mm/sec. The pressure is chosen to cause the fluid to be dispensed from the micro-structural fluid ejector onto the substrate.

Figure 20:
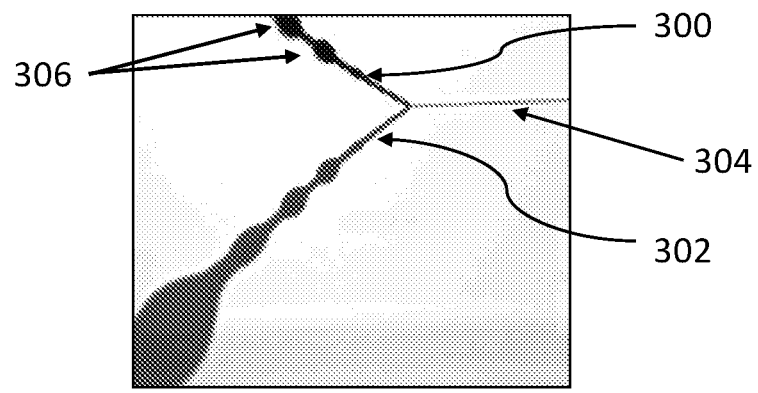
FIG. 20 is an example digital image of a tapering portion and its surroundings captured using a camera.
Figure 21:
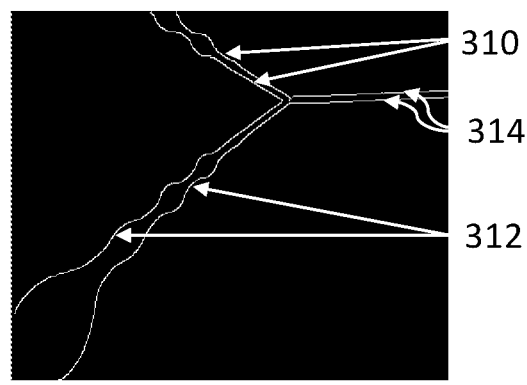
FIG. 21 is a result of pre-processing of the example digital image of FIG. 20.
Figure 22:
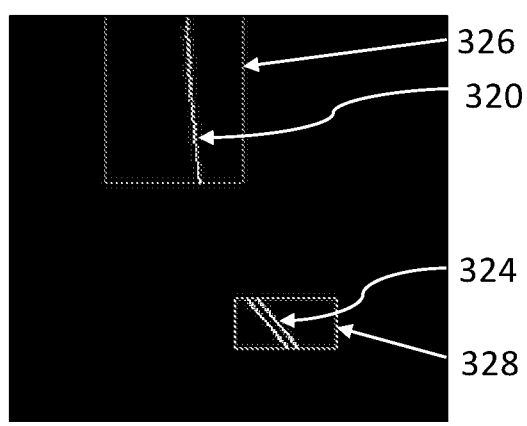
FIG. 22 is a result of processing of the example digital image of FIG. 21.
Figure 28:
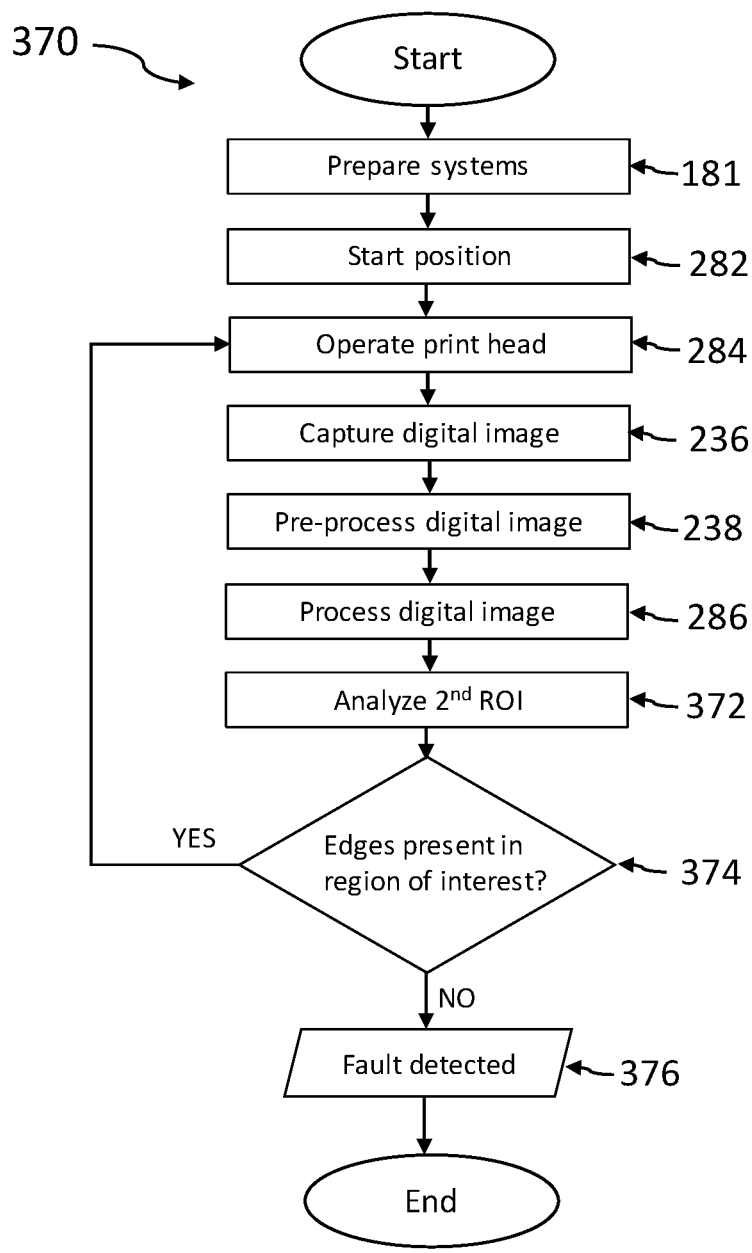
FIG. 28 is a flow diagram of a method of detecting a fault condition in fluid flow from a micro-structural fluid ejector onto a substrate, according to a third embodiment.

While the print head is being operated (step 284), a digital image of the tapering portion and its surroundings is captured using the camera (step 236) and the digital image undergoes pre-processing (step 238). These steps 236 and 238 have been described with reference to FIG. 12 (method 230). FIG. 20 is an example of a digital image of the tapering portion and its surroundings, captured at step 236. FIG. 20 shows an image of the tapering portion 300, an image of the reflection of the tapering portion 302, and an image of a printed feature 304. The printed feature 304 is being dispensed from the micro-structural fluid ejector (the tapering portion 300 of which is visible in the image) as the print head 104 is laterally displaced relative to the substrate 110. FIG. 21 is a result of pre-processing of the digital image of FIG. 20 (step 238). FIG. 21 includes detected edges 310 corresponding to the image of the tapering portion 300, detected edges 312 corresponding to the image of the reflection of the tapering portion 302, and detected edges 314 corresponding to the image of the printed feature 304. At step 286, the pre-processed digital image (step 238) is processed, to prepare the digital image for analysis in the subsequent step 288 which includes calculation of a bending coefficient A. FIG. 22 is a result of processing the digital image of FIG. 21. At step 286, the entire image is rotated to make the tapering portion edges (310 in the case of FIG. 21) approximately vertical, a first virtual bounding box 326 is created to identify a first region of interest (ROI) in a region where the tapering portion should be present, and a second virtual bounding box 328 is created to identify a second region of interest (ROI) in a region where the printed feature should be present. The second virtual bounding box 328 is discussed in relation to method 370 (FIG. 28). As implemented here, the image processing step (step 286) includes the identification of these first and second ROIs to enable methods 280 (contact adjustment) and 370 (fault detection) to run concurrently while operating the print head. The first or second region of interest can be omitted if only one of the methods (370 or 280) is run. Pixels outside the first and second virtual bounding boxes (326, 328) can be ignored. In this implementation, pixels outside the first and second virtual bounding boxes (326, 328) are converted to black pixels. The two detected edges 310 in the first virtual bounding box 326 are merged into a single merged edge 320. For each row in the first virtual bounding box 326, the horizontal position of the single merged edge is obtained by calculating the average of the horizontal positions of the first and last white pixels, corresponding approximately to the horizontal positions of the two detected edges.

At step 288, the first ROI, identified by the first virtual bounding box 326, is analyzed. This analysis includes calculating a least-squares fit of a second-degree polynomial of a form $y=Ax^2+Bx+C$, in which A, B, and C are coefficients and (x, y) are coordinates of points on the single merged edge 320, x being the horizontal pixel count and y being the vertical pixel count counted from an origin point. Coefficient A is referred to as a bending coefficient, because it represents the bending (deflection) of the tapering portion. Coefficients B and C can be obtained from the calculation but are not used in determining the bending. The tapering portion (identified by 300) which can be bent because of its long length in its longitudinal direction and its small diameter, is bent along the direction of lateral displacement of the print head relative to the substrate. For a tapering portion with no observable bending, the bending coefficient A would be zero. As bending of the tapering portion increases, the bending coefficient A increases.

At step 290, the bending coefficient A is compared to a minimum threshold value $A_{min}$ and a maximum threshold value $A_{max}$. If the bending coefficient is less than the minimum threshold value ($A<A_{min}$), then the bending is too small. In response, the print head positioning system lowers the print head toward the substrate by a downward vertical distance (step 292). Typically, the downward vertical distance is in a range of 0.5 µm to 10 µm. In the example shown in FIG. 25, the downward vertical distance is 2 µm. If the bending coefficient is greater than the maximum threshold value ($A>A_{max}$), then the bending is too large. In response, the print head positioning system raises the print head away from the substrate by an upward vertical distance (step 294). Typically, the upward vertical distance is in a range of 0.5 µm to 10 µm. In the example shown in FIG. 25, the upward vertical distance is 2 µm. If the bending coefficient is in a range of the minimum threshold value and the maximum threshold value ($A_{min} \leq A \leq A_{max}$), the bending is within an acceptable range and the vertical displacement of the print head is not adjusted.

In some cases, the minimum threshold value and maximum threshold value are chosen such that the maximum threshold value is twice to thrice the minimum threshold value ($2 A_{min} \leq A_{max}$ and $A_{max} \leq 3 A_{min}$). In some other cases, the minimum threshold value and maximum threshold value are chosen to be the same ($A_{min}=A_{max}$), in which case the print head positioning system attempts to adjust the vertical displacement of the print head to achieve a bend of $A=A_{min}=A_{max}$. Generally, the minimum threshold value is smaller than or equal to the maximum threshold value ($A_{min} \leq A_{max}$).

In order to achieve high productivity, the steps of digital image capture (step 236), image pre-processing (step 238), image processing (step 286), first ROI analysis (step 288), comparison of bending coefficients to minimum and maximum threshold values (step 290), and adjustment of print head vertical displacement (steps 292, 294) are carried out while the print head is operated (step 284). The aforementioned steps (284, 236, 238, 286, 288, 290, 292, and 294) of concurrently operating the imaging system, the print head positioning system, and the pneumatic system can be repeated until the desired printed feature is complete. The decision to repeat the steps or stop is made at step 296. For example, a stop decision is made when a predetermined printed feature has been dispensed.

Figure 23:
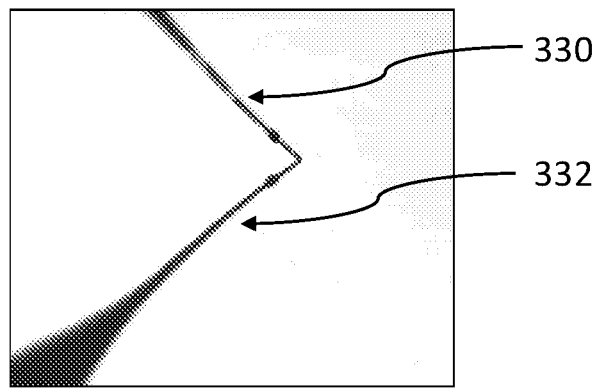
FIG. 23 is an example digital image captured before starting lateral displacement of the print head.
Figure 24:
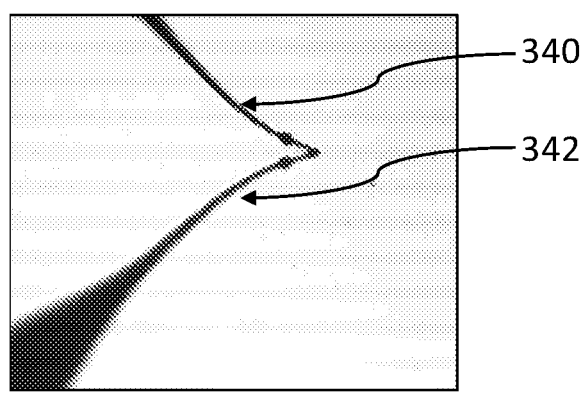
FIG. 24 is an example digital image captured after 5 cm of lateral displacement, without implementing the method of adjusting contact of the micro-structural fluid ejector to the substrate.
Figure 25:
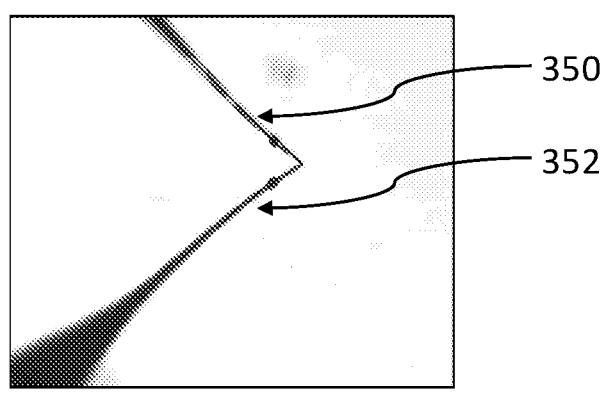
FIG. 25 is an example digital image captured after 5 cm of lateral displacement, while implementing the method of adjusting contact of the micro-structural fluid ejector to the substrate.

The benefit of using the contact adjustment method (method 280) is illustrated in FIGS. 23, 24, and 25. FIGS. 23, 24, and 25 illustrate tapering portions with no dispensing of fluid onto the substrate. FIG. 23 is an example digital image of a tapering portion captured before starting lateral displacement of the print head. An image of the tapering portion 330 and an image of the reflection of the tapering portion 332 are in contact with each other, indicating that the micro-structural fluid ejector 200 and the substrate 110 are in contact. The bending coefficient is 0.001 (A=0.001). FIG. 24 is an example digital image captured after 5 cm of lateral displacement of the print head relative to the substrate, without implementing contact adjustment method (method 280). The image of the tapering portion 340 and the image of the reflection of the tapering portion 342 in FIG. 24 are noticeably more bent than the image of the tapering portion 330 and the image of the reflection of the tapering portion 332 in FIG. 23. The bending coefficient is 0.009 (A=0.009). The bending is too large and additional bending may cause the tapering portion to break. FIG. 25 is an example digital image captured after 5 cm of lateral displacement, with the contact adjustment method (method 280) implemented. In this case the minimum threshold value $A_{min}$ was set at 0.002 and the maximum threshold value $A_{max}$ was set at 0.005. The image of the tapering portion 350 and the image of the reflection of the tapering portion 352 in FIG. 25 are noticeably less bent than the image of the tapering portion 340 and the image of the reflection of the tapering portion 342 in FIG. 24. The bending coefficient is 0.003 (A=0.003).

Figure 26:
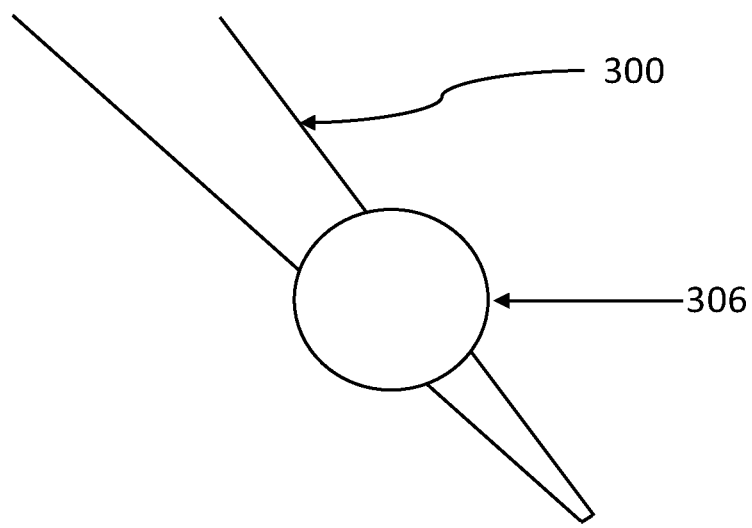
FIG. 26 is a schematic view of a digital image of a micro-structural fluid ejector during fluid printing.
Figure 27:
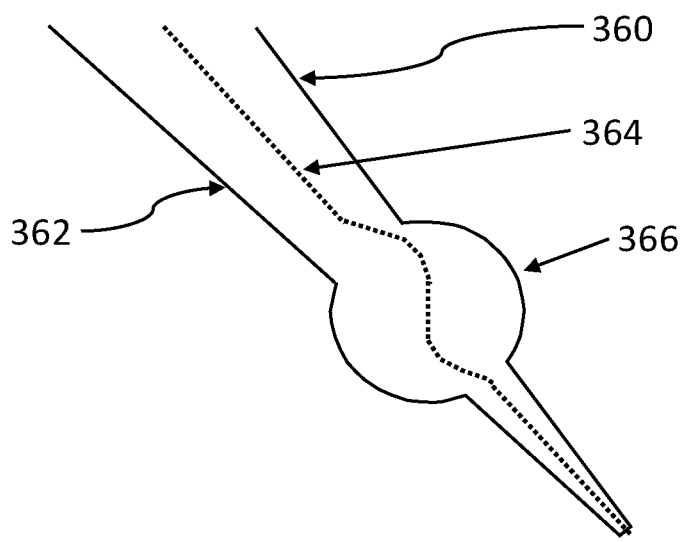
FIG. 27 is a schematic view of a result of pre-processing the digital image of FIG. 26.

The image processing step (step 286) preferably includes rotation of the entire image to make the tapering portion edges (310 in the case of FIG. 21) approximately vertical. It is feasible to calculate a least-squares fit of a second-degree polynomial of a form $y=Ax^2+Bx+C$ (step 288) regardless of the orientation of the tapering portion. However, it is advantageous to rotate the image. FIG. 20 shows some fluid droplets 306 having formed on the outer wall of the tapering portion. If pressure is applied to the fluid in the micro-structural fluid ejector when the micro-structural fluid ejector is not in contact with the substrate, ejected fluid travels upward along the outer wall of the tapering portion. Depending on the physico-chemical properties of the fluid and the surface properties of the outer wall, droplets may form on the outer wall within the field-of-view of the camera. FIG. 26 is a schematic view of a digital image of a tapering portion 300 having a fluid droplet 306 formed on its outer wall. FIG. 27 is a schematic view of the digital image of FIG. 26 after pre-processing, showing a first detected edge 360 and a second detected edge 362. Note that the detected edges 360, 362 incorporate the contour of the bubble 306. FIG. 27 also shows, for ease of comparison, a single merged edge 364 that might be derived from the detected edges 360, 362 during the image processing step 286. The presence of the bubble has perturbed the single merged edge 364 in a region 366 corresponding to where the bubble is located. This perturbation can be reduced by rotating the image to make the detected edges approximately vertical before calculation of a single merged edge.

FIG. 28 is a flow diagram of a method 370 of detecting a fault condition in fluid flow from a a micro-structural fluid ejector onto a substrate, according to a third embodiment. The fault condition is observable: the dispensing of fluid is stopped. Possible causes of this condition include a clogging of the fluid in the micro-structural fluid ejector, a failure of the pneumatic system, and depletion of the fluid supply. Steps 181, 282, 284, 236, 238, 286 are carried out as in method 280 (FIG. 19). At step 181, systems in the fluid printing apparatus 100 (FIG. 11) are prepared. Step 181 corresponds to the method 180 shown in FIG. 9. At step 282, the print head 104 is displaced relative to the substrate 110 to a start position. At step 284, the print head 104 is operated, namely pressure is applied to a fluid in the micro-structural fluid ejector 200 while the print head 104 is laterally displaced relative to the substrate 110 at a lateral displacement speed. While the print head is being operated (step 284), a digital image of the tapering portion and its surroundings is captured using the camera (step 236) and the digital image undergoes pre-processing (step 238).

At step 286, the entire image is rotated to make the tapering portion edges (310 in the case of FIG. 21) approximately vertical, a first virtual bounding box 326 is created to identify a first region of interest (ROI) in a region where the tapering portion should be present, and a second virtual bounding box 328 is created to identify a second region of interest (ROI). The second ROI is in a region where the printed feature dispensed from the micro-structural fluid ejector onto the substrate should be present, but the micro-structural fluid ejector should not be present (FIG. 22). At step 372, the second ROI is analyzed to determine whether detected edges are present therein. In the example of FIG. 22, printed feature edges 324 are visible in the second ROI identified by second virtual bounding box 328.

In order to achieve high productivity, the steps of digital image capture (step 236), image pre-processing (step 238), image processing (step 286), second ROI analysis (step 288) are carried out while the print head is operated (step 284). The aforementioned steps (284, 236, 238, 286, 288) of concurrently operating the imaging system, the print head positioning system, and the pneumatic system can be repeated until detected edges are not found in the second ROI (step 374). At step 374, if edges are not present in the in the second ROI, then a fault condition is returned (step 376).

Figure 29:
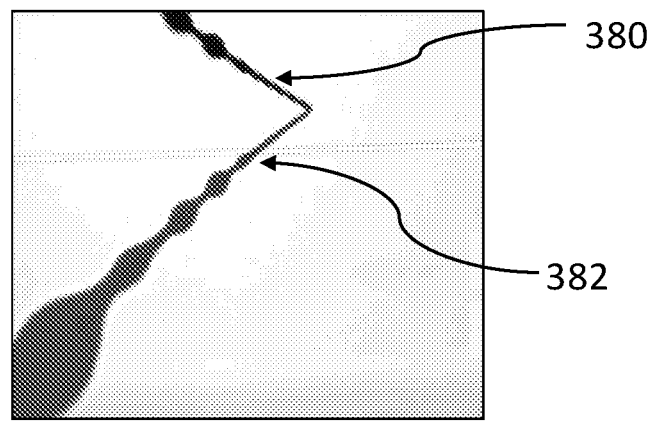
FIG. 29 is an example digital image captured when there is a fault condition.
Figure 30:
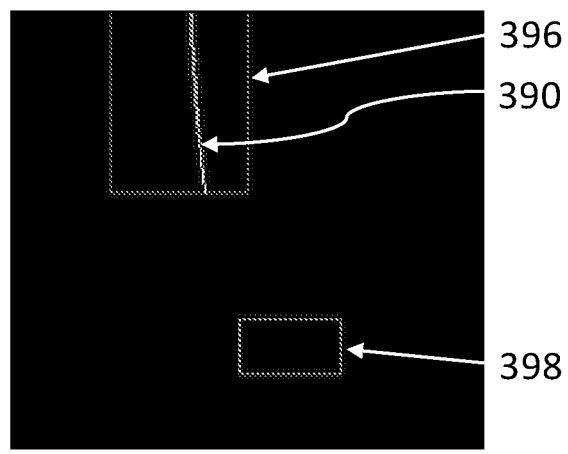
FIG. 30 is a result of pre-processing and processing of the example digital image of FIG. 29.

FIGS. 29 and 30 illustrate an example where detected edges are not present in the second region of interest (ROI). FIG. 29 is an example of a digital image of the tapering portion and its surroundings, captured at step 236 (FIG. 28). FIG. 29 shows an image of the tapering portion 380 and an image of the reflection of the tapering portion 382 but does not show any printed feature. It is expected that a printed feature would be dispensed from the micro-structural fluid ejector as the print head is laterally displaced. FIG. 30 is a result of pre-processing step 238 (including edge detection) and processing step 286 (including image rotation, identification of first and second regions of interest, and merging of detected edges in the first region of interest). The second region of interest identified by second virtual bounding box 398 does not contain any detected edges.

The contact adjustment method (method 280) and the fault detection method (method 370) include initial steps of preparing systems (step 181) and displacement to a start position (step 282). The step of preparing systems (step 181) is also an initial step in the contact detection method (method 230). Preferably, the start position is the position at which the micro-structural fluid ejector and the substrate are in contact, as determined in method 230. Therefore, the initial steps 181 and 282 of the contact adjustment method (method 280) and the fault detection method (method 370) can be accomplished by carrying out method 230. Furthermore, after the initial steps 181 and 282 are completed, the methods 280 and 370 can be carried out concurrently. This idea is illustrated with reference to FIG. 31.

Figure 31:
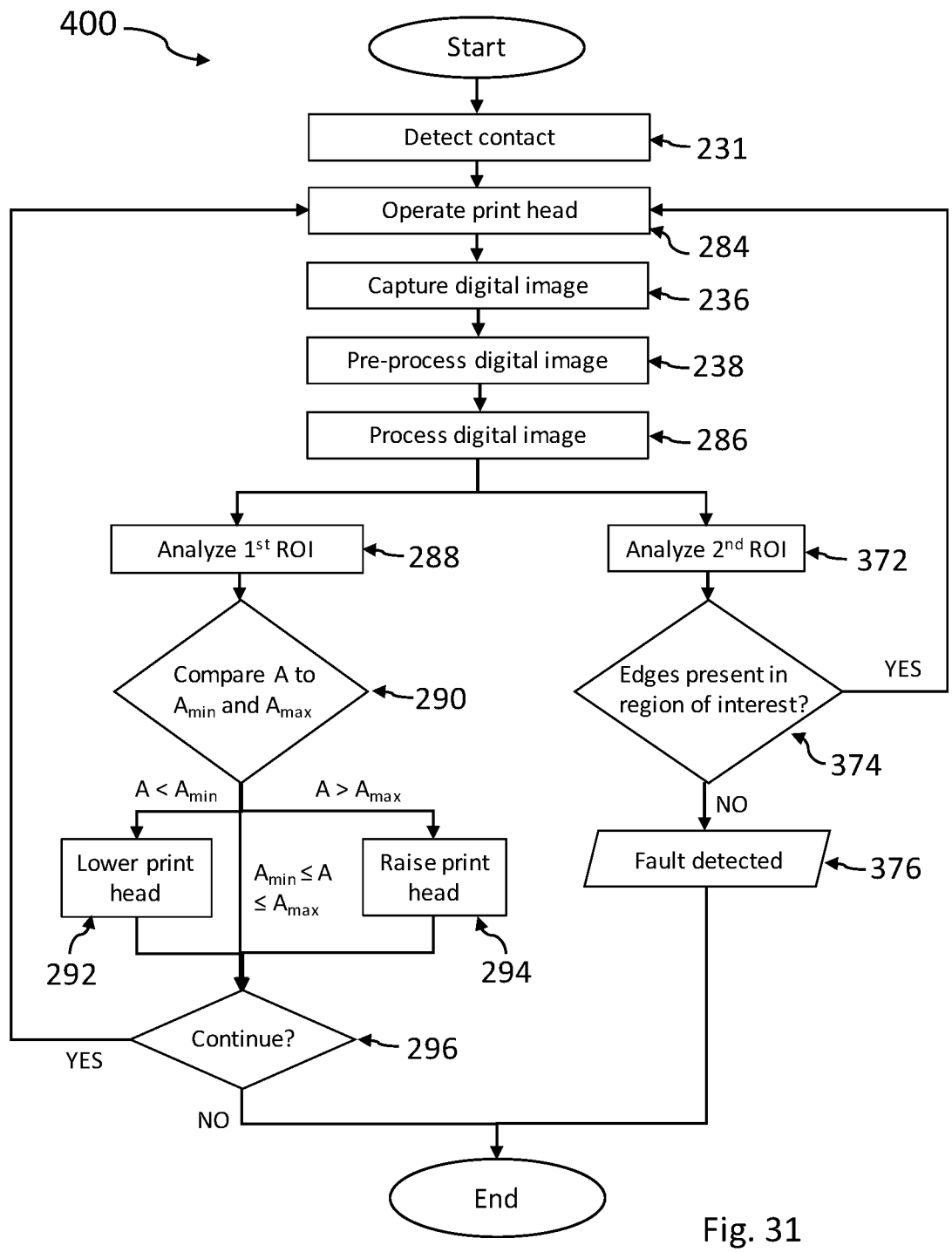
FIG. 31 is a flow diagram of a method of adjusting contact of a micro-structural fluid ejector to a substrate and detecting a fault condition in fluid flow from a micro-structural fluid ejector onto a substrate, according to a fourth embodiment.

FIG. 31 is a flow diagram of a method 400 of operating a print head while concurrently adjusting the contact of the micro-structural fluid ejector to the substrate and detecting a fault condition in the fluid flow from the micro-structural fluid ejector onto the substrate, according to a fourth embodiment. Initially, a contact detection step (step 231), corresponding to method 230, is carried out. The other steps in method 400 have been described with reference to methods 280 and/or 370. The steps of operating the print head (step 284), digital image capture (step 236), image pre-processing (step 238), and image processing (step 286) are common to methods 280 and 370. The steps associated with the first ROI (steps 288, 290, 292, 294, 296) and the steps associated with the second ROI (steps 372, 374, and 376) are carried out concurrently after the image processing step (step 286). The steps of digital image capture (step 236), image pre-processing (step 238), image processing (step 286), the first ROI-related steps, and the second ROI-related steps are preferably carried out while the print head is operated (step 284) for improved productivity.

In one implementation, step 231 is carried out using a contact detection module in the software. When step 231 is completed, the contact detection module is turned off, and the contact adjustment module and the fault detection module are turned on. Method 280 is carried out using the software's contact adjustment module, and method 370 is carried out using the software's fault detection module. The contact adjustment module and the fault detection module share the steps of image capture (step 236), image pre-processing (step 238), and image processing (step 286).

Unless otherwise indicated, all numbers expressing quantities of components, molecular weights, and so forth used in the specification and claims are to be understood as being modified in all instances by the term "about." Accordingly, unless otherwise indicated to the contrary, the numerical parameters set forth in the specification and claims are approximations that may vary depending upon the desired properties sought to be obtained by the present invention. At the very least, and not as an attempt to limit the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. All numerical values, however, inherently contain a range necessarily resulting from the standard deviation found in their respective testing measurements.

All headings are for the convenience of the reader and should not be used to limit the meaning of the text that follows the heading, unless so specified.

What is claimed is:

1. A method of detecting contact of a micro-structural fluid ejector to a substrate, comprising:
 positioning the substrate on a substrate stage;
 providing a print head comprising the micro-structural fluid ejector, the micro-structural fluid ejector comprising: an output portion comprising an exit orifice having an output inner diameter, an input portion having an input inner diameter that is greater than the output inner diameter by a factor of at least 100, and a tapering portion between the input portion and the output portion;
 installing the print head above the substrate, the micro-structural fluid ejector being oriented with the exit orifice pointing downward;
 providing an imaging system comprising a camera, the tapering portion being located within a field-of-view of the camera;
 providing a print head positioning system which controls a vertical displacement and a lateral displacement of the print head and of the camera relative to the substrate;
 operating the imaging system to determine a current length;
 if a previous length is empty, or if the previous length is not empty but the current length is not greater than a sum of the previous length and a minimum length difference, then:
  retaining the current length as the previous length,
  lowering the print head toward the substrate by a vertical distance, and
  repeating operating the imaging system; and
 if the previous length is not empty and the current length is greater than the sum of the previous length and a minimum length difference, then determining that the micro-structural fluid ejector and substrate are in contact;
 wherein operating the imaging system comprises:
  capturing a digital image of the tapering portion and its surroundings;
  pre-processing the digital image to detect edges; and
  analyzing the digital image in a region of interest where the tapering portion and its reflection should be present to calculate the current length, the current length being defined as a length of a longest contiguous one of the detected edges intersecting a top edge of the region of interest.

2. The method of claim 1, wherein the output inner diameter is in a range of 0.5 µm to 5 µm.

3. The method of claim 1, wherein the vertical distance is in a range of 0.5 µm to 10 µm.

4. The method of claim 1, wherein the region of interest is an entirety of the digital image.

5. The method of claim 1, wherein the region of interest is defined by a virtual bounding box within the digital image.

6. The method of claim 1, wherein the previous length, the current length, and the minimum length difference are expressed in number of pixels.

7. The method of claim 6, wherein the minimum length difference is 50 pixels or less.

8. The method of claim 1, wherein the field-of-view has a horizontal dimension within a range of 50 to 500 times the output inner diameter and a vertical dimension within a range of 50 to 500 times the output inner diameter.

9. The method of claim 1, wherein the camera has a frame rate of 10 frames per second or greater.

10. The method of claim 1, wherein the camera has a resolution of 0.2 Megapixels or greater.

* * * * *